United States Patent [19]

Yoshida et al.

[11] Patent Number: 4,839,900
[45] Date of Patent: * Jun. 13, 1989

[54] BURIED TYPE SEMICONDUCTOR LASER DEVICE

[75] Inventors: Toshihiko Yoshida; Haruhisa Takiguchi, both of Tenri; Shinji Kaneiwa, Nara; Hiroaki Kudo; Sadayoshi Matsui, both of Tenri, all of Japan

[73] Assignee: Sharp Kabushiki Kaisha, Osaka, Japan

[*] Notice: The portion of the term of this patent subsequent to Mar. 8, 2005 has been disclaimed.

[21] Appl. No.: 897,337

[22] Filed: Aug. 15, 1986

[30] Foreign Application Priority Data

| Aug. 21, 1985 | [JP] | Japan | 60-184650 |
|---|---|---|---|
| Sep. 10, 1985 | [JP] | Japan | 60-201161 |
| Sep. 11, 1985 | [JP] | Japan | 60-202463 |
| Sep. 12, 1985 | [JP] | Japan | 60-203627 |
| Sep. 19, 1985 | [JP] | Japan | 60-207869 |

[51] Int. Cl.$^4$ ................................ H01S 3/18
[52] U.S. Cl. .......................... 372/46; 372/44; 372/45
[58] Field of Search ............... 372/44, 45, 46, 48; 357/17

[56] References Cited

U.S. PATENT DOCUMENTS

| 4,048,627 | 7/1977 | Ettenbert et al. | 357/17 |
|---|---|---|---|
| 4,597,085 | 6/1986 | Mito et al. | 372/45 |
| 4,730,329 | 3/1988 | Yoshida et al. | 372/46 |

FOREIGN PATENT DOCUMENTS

| 0053473 | 4/1980 | Japan | 372/46 |
|---|---|---|---|
| 0170089 | 10/1983 | Japan | 372/46 |

OTHER PUBLICATIONS

Higuchi et al.: Laser Kenkyu vol. 13, p. 156, 1985; "Leakage Current in p-Substrate 1.3 $\mu$mm InGaAsP-/InP Buried Crescent (PBC) Lasers".

R. Hirano et al.: Appl. Phys. Lett 43(2), Jul. 15, 1983, "Position of the Degradation & the Improved/Structure for the Buried Crescent InGaAsP Lasers".

Japanese Journal of Applied Physics, vol. 16, No. 8, Aug. 1977; "AlGaAs–GaAs Semiconductor Ring Laser"; pp. 1395–1398.

N. K. Dutta: J. Appl. Phys. 53(11), Nov. 1982; "Calculated Threshold Current of GaAs Quantum Well Lasers"; pp. 7211–7214.

H. Iwamura: Electronics Letters, vol. 19, No. 5, Mar. 3, 1983; "Dynamic Behaviour of a GaAs–AlGaAs MQW Laser Diode"; pp. 180–181.

Primary Examiner—William L. Sikes
Assistant Examiner—B. R. R. Holloway
Attorney, Agent, or Firm—Irell & Manella

[57] ABSTRACT

A buried type semiconductor laser device comprising a multi-layered epitaxial growth crystal including a striped laser-oscillation operating area on a semiconductor substrate, wherein said laser-oscillation operating area contains a buffer layer having the same polarity as said substrate, an active layer and a cladding layer having a polarity different from that of said substrate, said laser-oscillation operating area being sandwiched between one part of the burying layer and another part of the burying layer, which are disposed on said substrate and which have a polarity different from that of said substrate, through said substrate or a diffusion region having an impurity with the same polarity as said substrate so as to electrically isolate said burying layer from said cladding layer, thereby maintaining ineffective current flowing from said cladding layer to said burying layer at a low level even when current injected into said device is increased.

3 Claims, 9 Drawing Sheets

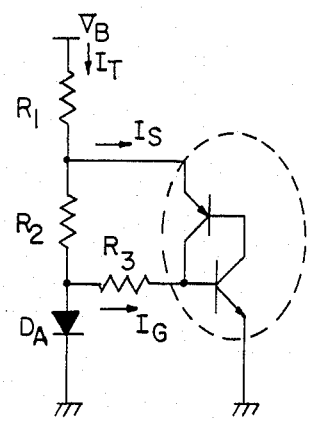 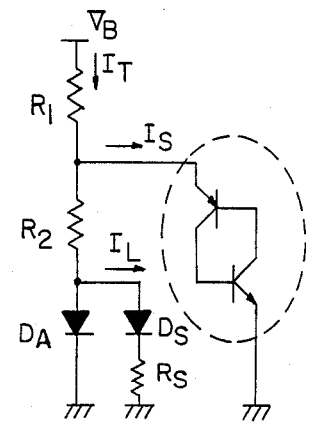
FIG.6A
PRIOR ART
FIG.6B
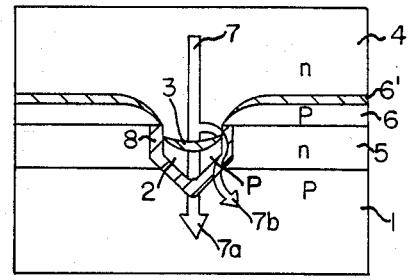
FIG.7

FIG.12A
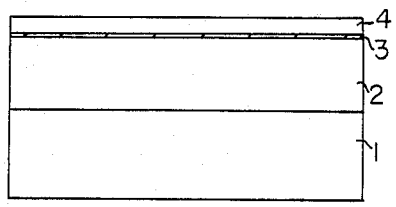
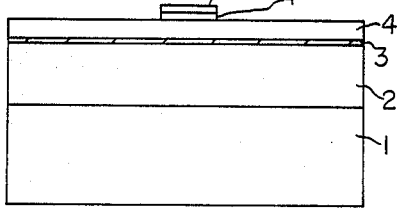
FIG.12B
FIG.12C
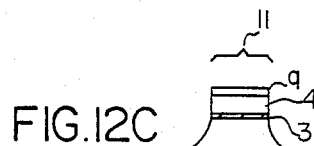
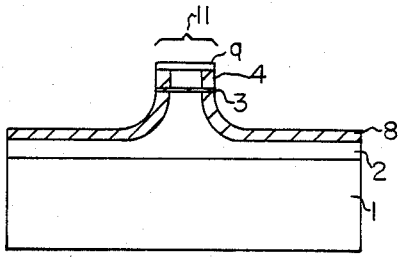
FIG.12D

BURIED TYPE SEMICONDUCTOR LASER DEVICE

BACKGROUND OF THE INVENTION

1. Field of the Invention:

This invention relates to a buried type semiconductor laser device, which effectively suppresses ineffective current that is useless for laser oscillation even when current injected into the device is increased.

2. Description of the Prior Art:

Buried type semiconductor laser devices, in which an active layer for laser oscillation is surrounded by semiconductor layers having a refractive index smaller than that of the active layer and an energy gap larger than that of the active layer, are advantageous in that laser oscillation can be attained in a stable transverse mode at a low threshold current level and modulation can be attained at high speed, and accordingly they have been used as light sources for optical communication systems and/or optical measuring systems using optical fibers. For these reasons, they are industrially important devices. However, with such buried type semiconductor laser devices, ineffective current not passing through the active layer greatly increases with an increase in current injected into the devices, which causes limitations on the maximum value of the output power of the devices. Moreover, the ineffective current increases with a rise in temperature, which causes limitations on the temperature ranges in which the laser devices are used and which causes difficulties in the practical application of these buried type semiconductor laser devices, especially InGaAsP/InP semiconductor laser devices having a light-emitting wavelength in the range of 1.1 to 1.6 $\mu$m at which optical fibers undergo little optical loss.

The reason why the above-mentioned ineffective current arises seems to be as follows: Buried type semiconductor laser devices are, for example, provided with the structures shown in FIGS. 14 and 15. The laser device shown in FIG. 14, is produced as follows: On an n-InP substrate 1, an n-InP buffer layer 2, a non-doped InGaAsP active layer 3, and a p-InP cladding layer 4 are successively grown by an epitaxial growth technique. The resulting multilayered epitaxial growth crystal is subjected to a chemical etching treatment to form a mesa. Then, on both sides of the mesa, a p-InP burying layer 5 and an n-InP burying layer 6 are grown. The laser device shown in FIG. 15 is produced as follows: On an n-InP substrate 1, a p-InP burying layer 5 and an n-InP burying layer 6 are successively grown by an epitaxial growth technique. The resulting epitaxial growth crystal is subjected to a chemical etching treatment to form a channel. Then, an n-InP buffer layer 2, an InGaAsP active layer 3, and a p-InP cladding layer 4 are successively grown in the channel.

The device produced according to the production mode shown in each of FIGS. 14 and 15 attains laser oscillation depending upon the injected current 7 passing through the active layer 3. Since the p-n junction at the interface between the burying layers 5 and 6 positioned at the sides of the active layer 3 is reversely biased, little current passes through the burying layers 5 and 6 when the injected current 7 is small. However, a considerable amount of current passes through the burying layers 5 and 6 positioned at the sides of the active layer 3 as the injected current 7 increases. This is because a thyristor composed of the cladding layer 4, the n-burying layer 6, the p-burying layer 5 and the buffer layer 2 (or the substrate 1) is made conductive by a gate current 7b which flows from the cladding layer 4 to the burying layer 5 (Higuchi et al: Laser Kenkyu Vol. 13, p. 156, 1985). If the active layer 3 is formed at the interface between the lower burying layer 5 and the upper burying layer 6, the injected current (i.e., the gate current) 7b will be reduced. However, such a precise control of the thickness of layers cannot be made using liquid phase epitaxy and chemical etching techniques at the present. Thus, the ineffective current mentioned above cannot be prevented.

SUMMARY OF THE INVENTION

The buried type semiconductor laser device of this invention, which overcomes the above-discussed and numerous other disadvantages and deficiencies of the prior art, comprises a multi-layered epitaxial growth crystal including a striped laser-oscillation operating area on a semiconductor substrate, wherein said laser-oscillation operating area contains a buffer layer having the same polarity as said substrate, an active layer and a cladding layer having a polarity different from that of said substrate, said laser-oscillation operating area being sandwiched between one part of the burying layer and another part of the burying layer, which are disposed on said substrate and which have a polarity different from that of said substrate, through said substrate or a diffusion region having an impurity with the same polarity as said substrate so as to electrically isolate said burying layer from said cladding layer, thereby maintaining ineffective current flowing from said cladding layer to said burying layer at a low level even when current injected into said device is increased.

In a preferred embodiment, the laser-oscillation operating area is formed within a striped channel formed in a mesa of said substrate and is sandwiched between one part of the burying layer and another part of the burying layer, which are disposed outside of the mesa of said substrate, through the portion of said substrate positioned between the laser-oscillation operating area and each part of the burying layer so as to electrically isolate said burying layer from said cladding layer. In a more preferred embodiment, the multi-layered growth crystal is formed on the (100) plane of said substrate and said striped channel is formed in the <011> direction of said substrate.

In a preferred embodiment, the laser-oscillation operating area is formed within a striped channel reaching said substrate through said burying layer disposed on said substrate and is sandwiched between one part of the burying layer and another part of the burying layer through said diffusion region formed on the inner wall of said channel so as to electrically isolate said burying layer from said cladding layer. In a more preferred embodiment, the multi-layered growth crystal is formed on the (100) plane of said substrate and said striped channel is formed in the <011> direction of said substrate. The diffusion region is, in a preferred embodiment, formed on a portion of the inner wall, or on the whole area of the inner wall of said striped channel. In a more preferred embodiment, the substrate is of a p-substrate and the impurity forming said diffusion region is Zn or Cd.

In a preferred embodiment, the laser-oscillation operating area is formed within a striped channel formed in the central area of said substrate and is sandwiched between one part of the burying layer and another part of the burying layer, which are formed by diffusing an impurity into the outside of the central area of said substrate, through the portion of said substrate positioned between said laser-oscillation operating area and each part of said burying layer, thereby electrically isolating said burying layer from said cladding layer. In a more preferred embodiment, the multi-layered growth crystal is formed on the (100) plane of said substrate and said striped channel is formed in the <011> direction of said substrate. In a more preferred embodiment, the substrate is of an n-substrate and the impurity forming said burying layers is Zn or Cd.

In a preferred embodiment, the laser-oscillation operating area is formed into a mesa-stripe on said substrate and is sandwiched between one part of the burying layer and another part of the burying layer, which are disposed outside of said mesa, through said diffusion region formed on the outer wall of said mesa, thereby electrically isolating said burying layer from said cladding layer. In a more preferred embodiment, the upper face of said buffer layer positioned on both sides of said mesa is flat or concaved into a channeled shape. In a more preferred embodiment, the multi-layered growth crystal is formed on the (100) plane of said substrate and said mesa is formed in the <011> direction of said substrate.

Thus, the invention described herein makes possible the objects of (1) providing a semiconductor laser device in which the flow of current into burying layers positioned at the sides of an active layer is suppressed so that ineffective current is minimal even though current injected into the device is increased; (2) providing a semiconductor laser device in which high output power operation can be achieved without an increase in ineffective current regardless of an increase in current injected into the device, so that the device is suitable for a signal light source; and (3) providing a semiconductor laser device in which, since ineffective current not passing through the active layer is minimal, heat generation of the device due to the ineffective current is prevented and the device operates even at a significantly high temperature.

BRIEF DESCRIPTION OF THE DRAWINGS

This invention may be better understood and its numerous objects and advantages will become apparent to those skilled in the art by reference to the accompanying drawings as follows:

FIG. 6(A) is an electrically equivalent circuit of the conventional semiconductor laser devices shown in FIGS. 14 and 15.

FIG. 6(B) is an electrically equivalent circuit of the semiconductor laser device shown in FIG. 4.

FIG. 7 is a sectional front view showing another semiconductor laser device of this invention.

FIGS. 12(A), 12(B) and 12(C) are diagrams showing a process for the production of the semiconductor laser device shown in FIG. 11.

DESCRIPTION OF THE PREFERRED EMBODIMENTS

This invention provides a buried type semiconductor laser device which comprises a multi-layered epitaxial growth crystal including a striped laser-oscillation operating area on a p- or n- semiconductor substrate. The laser-oscillation operating area contains a buffer layer having the same polarity as the substrate, an active layer for laser oscillation, and a cladding layer having a polarity different from that of the substrate. The laser-oscillation operating area is positioned between one part of the burying layer and another part of the burying layer, which are disposed on the substrate and which have a polarity different from that of the substrate, through the substrate or a diffusion region having an impurity with the same polarity as the substrate so as to electrically isolate the burying layer from the cladding layer, thereby maintaining an ineffective current flowing from the cladding layer to the burying layer at a low level even when current injected into the device is increased.

EXAMPLE 1

This example provides a buried type semiconductor laser device, wherein the laser-oscillation operating area is formed within a striped channel formed in a mesa of the substrate and is sandwiched between one part of the burying layer and another part of the burying layer, which are disposed outside of the mesa of said substrate, through the portion of said substrate positioned between the laser-oscillation operating area and each part of the burying layer so as to electrically isolate said burying layer from said cladding layer.

Figure 1:
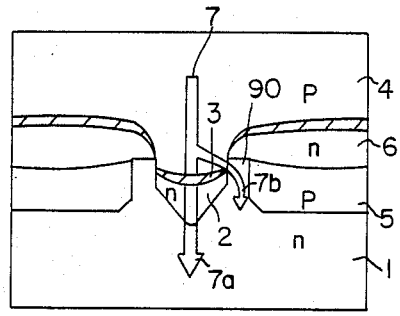
FIG. 1 is a sectional front view showing a semiconductor laser device of this invention.
Figure 2A:
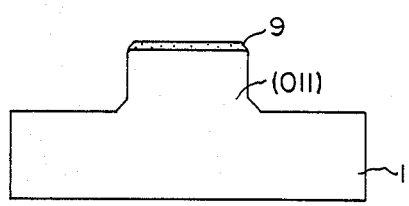
FIGS. 2(A), 2(B) and 2(C) are diagrams showing a process for the production of the semiconductor laser device shown in FIG. 1.
Figure 2B:
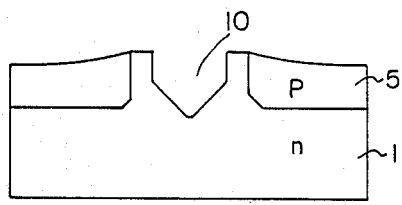
Figure 2C:
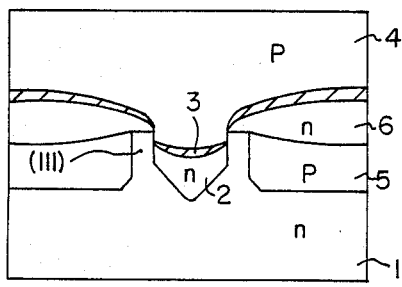

FIG. 1 shows the semiconductor laser device of this example, which is produced as follows: On the (100) plane of an n-InP substrate 1, a $SiO_2$ film is formed by plasma assisted chemical vapor deposition, which is then etched by photolithography to form a striped $SiO_2$ film 9 having a width of 7 μm in the <011> direction. Then, the InP substrate 1 is subjected to an etching treatment with concentrated hydrochloric acid to form a mesa-stripe <011> having a height of 1 μm, as shown in FIG. 2(A), corresponding to the striped $SiO_2$ film 9 functioning as a masking substance. Then, a p-InP first burying layer 5 is grown on the substrate by liquid phase epitaxy and the striped SiO$_2$ film 9 is removed by hydrofluoric acid. As a result, the mesa <011> is sandwiched between one part of the burying layer 5 and another part of the burying layer 5 positioned on the substrate 1. Then, a striped channel 10 having a width of 4 μm is formed in the center of the mesa <011> by photolithography using concentrated hydrochloric acid as shown in FIG. 2(B). Then, an n-InP cladding layer (i.e., an n-InP buffer layer) 2 and an n-InP second burying layer 6 are simultaneously grown by liquid phase epitaxy, followed by successively growing a non-doped InGaAsP active layer 3 and a p-InP cladding layer 4 as shown in FIG. 2(C). Then, the back face of the substrate 1 and the upper face of the cladding layer 4 are subjected to a vapor deposition treatment with metal materials of Au-Ge-Ni and Au-Zn, respectively, followed by heating to form an n-sided electrode (not shown) of an alloy of Au-Ge-Ni and a p-sided electrode (not shown) of an alloy of Au-Zn.

Figure 3A:
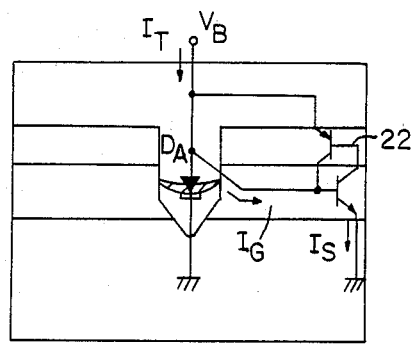
FIG. 3(A) is an electrically equivalent circuit superimposed on the sectional front view of the conventional buried type semiconductor laser device shown in FIG. 15.
Figure 3B:
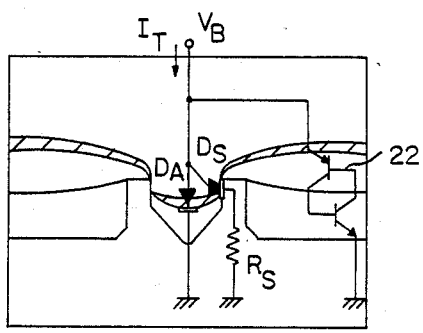
FIG. 3(B) is an electrically equivalent circuit superimposed on the sectional font view of the semiconductor laser device of this invention shown in FIG. 1.

One main feature of this semiconductor laser device is in that the first burying layer 5 is electrically isolated from the cladding layer 4 by the wall (111) of the mesa <011> so that the current blocking layer of a thyristor composed of the cladding layer 4, the second burying layer 6, the first burying layer 5 and the substrate 1 can be maintained to be non-conductive. Due to the wall (111) of the mesa <011>, the gate current 7b such as that discussed in FIG. 14 never flows from the cladding layer 4 to the first burying layer 5. However, with this semiconductor laser device having the above-mentioned structure, ineffective current flows, instead, from the cladding layer 4 to the substrate 1 through the wall (111) of the mesa <011> without passing through the active layer 3. This fact can be explained in greater detail by FIG. 3, wherein FIG. 3(A) shows an electrically equivalent circuit superimposed on a sectional front view of the conventional semiconductor laser devices shown in FIG. 14 (the conventional semiconductor device shown in FIG. 15 is represented by the same electrically equivalent circuit as that of FIG. 14) and FIG. 3(B) shows an electrically equivalent circuit superimposed on a sectional front view of the semiconductor laser device of this example shown in FIG. 1. A current-blocking structure can be represented by the equivalent circuit 22 of a thyristor in both the semiconductor laser devices shown in FIG. 1 and FIGS. 14 or 15.

With the conventional device structure represented by the equivalent circuit shown in FIG. 3(A), the gate current ($I_G$) 7b increases with an increase in the injected current ($I_T$) 7, and the thyristor becomes conductive. Due to the amplification function of the thyristor, a current ($I_S$) which is extremely larger than the gate current ($I_G$) arises. The current ($I_S$) is an ineffective current which does not pass through a double-heterostructure light-emitting area containing the active layer 3 represented by a diode $D_A$. Thus, with conventional devices represented by the equivalent circuit shown in FIG. 3(A), the ineffective current steeply increases with an increase in the injected current ($I_T$).

On the other hand, with the device structure of this invention represented by the equivalent circuit shown in FIG. 3(B), ineffective current which passes through a diode $D_S$ (corresponding to the p-n junction formed by the cladding layer 4 and the wall (111) of the mesa <011>) arranged in parallel to a diode $D_A$ (corresponding to the active layer 3) increases with an increase in the injected current ($I_T$). However, the amount of ineffective current is only proportional to the amount of injected current, and the thyristor is maintained to be non-conductive. Thus, the increase in the ineffective current in the device structure of this invention shown in FIG. 3(B) is extremely smaller than that of the effective current in the conventional device structure shown in FIG. 3(A), thereby allowing high output power operation.

As mentioned above, the laser device of this example produces little ineffective current so that oscillating operation at a high output power of 70 mW or more at room temperature can be achieved. Moreover, the effect on heat generation due to ineffective current is so small that laser oscillation can be attained even at a temperature of as high as 140° C. or more.

Although the above-mentioned example discloses only a device in which an n-substrate is used for the epitaxial growth substrate, a device using a p-substrate therein as the growth substrate can attain the same effect as mentioned above. An InGaAsP crystal having a light emitting wavelength of 1.3 μm is used for the active layer of the device of this example, but this invention is not limited thereto. Any InGaAsP crystal (having a light emitting wavelength in the range of 1.1 to 1.6 μm), the lattice constant of which matches that of InP crystals, can be used for the active layer. Although the InP substrate is etched to form a mesa-stripe in the above-mentioned example, a buffer layer of either InP having the same polarity as the substrate or InGaAsP having a lattice constant matching that of InP and having an energy gap larger than that of the active layer can be, instead, grown on the InP substrate, followed by etching to form a mesastripe in the buffer layer. Due to the buffer layer, the effect of lattice distortion in the substrate can be reduced. Moreover, when the buffer layer is composed of InGaAsP having an energy gap smaller than that of InP, the resulting semiconductor laser device can more easily attain laser oscillation in a single transverse mode than the device obtained in the above-mentioned example. Although the above-mentioned example discloses only the InGaAsP/InP semiconductor laser device, it is, of course, applicable to GaAlAs/GaAs semiconductor laser devices, etc.

EXAMPLE 2

This example provides a buried type semiconductor laser device, wherein the laser-oscillation operating area is formed within a striped channel reaching the substrate through the burying layer disposed on said substrate and is sandwiched between one part of the burying layer and another part of the burying layer through a diffusion region formed on the inner wall of said channel so as to electrically isolate said burying layer from the cladding layer of the laser-oscillation operating area. The diffusion region is formed on the portion of the inner wall of said striped channel excluding the bottom area.

Figure 4:
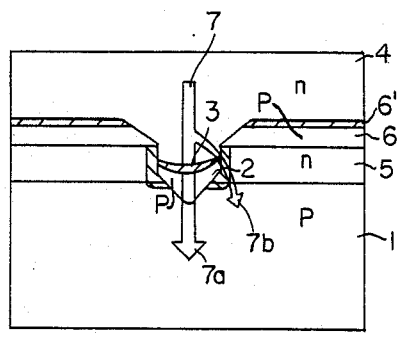
FIG. 4 is a sectional front view showing another semiconductor laser device of this invention.
Figure 5A:
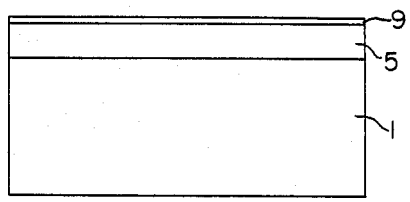
FIGS. 5(A), 5(B) and 5(C) are diagrams showing a process for the production of the semiconductor laser device shown in FIG. 4.
Figure 5B:
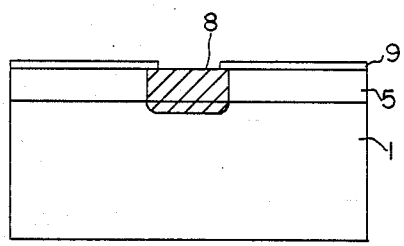
Figure 5C:
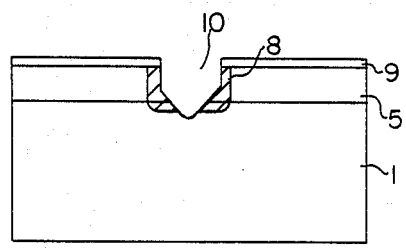

FIG. 4 shows the semiconductor laser device of this example which is produced as follows: On the (100) plane of a p-InP substrate 1, an n-InP first burying layer 5 is grown by liquid phase epitaxy. Then, a silicon nitride (SiNx) film 9 is formed on the first burying layer 5 by plasma assisted chemical vapor deposition as shown in FIG. 5(A). Then, a photoresist (not shown) is formed into a striped pattern having a width of 2.5 μm in the <011> direction on the silicon nitride film 9 by photolithography, and the silicon nitride film 9 is etched by an etchant (HF:NH$_4$F = 1:40), using the striped photoresist as a masking substance. Then, a p-impurity such as Zn is diffused into the p-InP substrate 1 through the n-InP burying layer 5, using the silicon nitride film 9 as a masking substance, resulting in a p-diffusion region 8, as shown in FIG. 5(B), which spreads over the portion under the silicon nitride film. Then, a striped channel 10 is formed within the diffusion region 8 in a manner to reach the substrate by an etching technique using concentrated hydrochloric acid as shown in FIG. 5(C). Since the width of the striped channel 10 is narrower than that of the opening of the silicon nitride film 9, the striped channel 10 can be formed in the center of the Zn diffusion region 8 with excellent regulation. The etchant is not limited to concentrated hydrochloric acid, but any etchant can be used provided that the width of the channel 10 is made narrower than that of the Zn diffusion region 8.

Then, the silicon nitride film 9 is removed, and as shown in FIG. 4, a p-InP buffer layer 2 and a p-InP second burying layer 6 are simultaneously grown by liquid phase epitaxy, followed by simultaneously growing a non-doped InGaAsP active layer 3 and a p-InP third burying layer 6'. The active layer 3 has a refractive index higher than that of the buffer layer 2 and has an energy gap smaller than that of the buffer layer 2. Then, an n-InP cladding layer 4 is grown on the active layer 3 and the third burying layer 6' by liquid phase epitaxy, resulting in a multi-layered crystal structure. The buffer layer 2 and the active layer 3 formed within the stripe channel 10 constitute a laser-oscillation operating area. The second burying layer 6 and the third burying layer 6' are successively disposed on the first burying layer 5 positioned outside of the channel 10. The n-cladding layer 4 is positioned at both the inside and the outside of the channel 10. As a result, the laser-oscillation operating area is sandwiched between one part of the burying layer 5 and another part of the burying layer 5 through the diffusion region 8. Then, a p-sided electrode (not shown) and an n-sided electrode (not shown) are formed on the back face of the substrate 1 and the upper face of the cladding layer 4, respectively, followed by cleaving at the (011) plane to form a semiconductor laser device.

Figure 14:
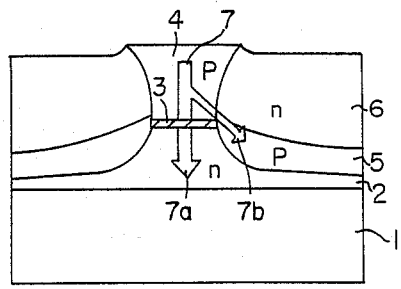
FIG. 14 is a sectional front view showing a conventional buried type semiconductor laser device.
Figure 15:
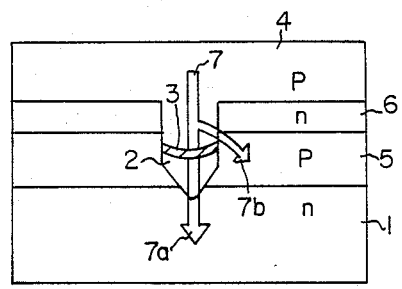
FIG. 15 is a sectional front view showing another conventional buried type semiconductor laser device.

One main feature of this semiconductor laser device is in that the first burying layer 5 is electrically isolated from the cladding layer 4 by the Zn diffusion region 8 having a polarity different from those of the layers 4 and 5, so that the gate current 7b such as that discussed in FIG. 14 never flows from the cladding layer 4 into the first burying layer 5. Thus, even though the injected current 7 is increased in order to increase the output power of the device, the current blocking layer of a thyristor composed of the cladding layer 4, the second burying layer 6, the first burying layer 5, and the buffer layer 2 (or the substrate 1) is maintained to be non-conductive, thereby maintaining the ineffective current at an extremely low level. This fact can be explained in greater detail by FIG. 6, wherein FIG. 6(A) shows an electrically equivalent circuit of the conventional semiconductor laser devices shown in FIGS. 14 and 15 and FIG. 6(B) shows an electrically equivalent circuit of the semiconductor laser device of this example shown in FIG. 4. A current-blocking structure can be represented by the equivalent circuit of a thyristor, i.e., the circuit surrounded by the dotted circle, in both the semiconductor laser devices shown in FIG. 4 and FIGS. 14 or 15.

With the conventional device structure represented by the equivalent circuit shown in FIG. 6(A), the gate current ($I_G$) 7b increases with an increase in the injected current ($I_T$) 7, and the thyristor becomes conductive. Due to the amplification function of the thyristor, a current ($I_S$) which is extremely larger than the gate current ($I_G$) arises. The current ($I_S$) is an ineffective current which does not pass through the active layer 3 represented by a diode $D_A$. Thus, with conventional devices represented by the equivalent circuit shown in FIG. 6(A), the ineffective current steeply increases with an increase in the injected current ($I_T$).

On the other hand, with the device structure of this invention represented by the equivalent circuit shown in FIG. 6(B), ineffective current which passes through a diode $D_S$ (corresponding to the p-n junction formed among the cladding layer 4 and the Zn diffusion region 8) arranged in parallel to a diode $D_A$ (corresponding to the active layer 3) increases with an increase in the injected current ($I_T$). However, the amount of ineffective current is only proportional to the amount of injected current, and the thyristor is maintained to be non-conductive. Thus, the increase in the ineffective current in the device structure of this invention shown in FIG. 6(B) is extremely smaller than that of the effective current in the conventional device structure shown in FIG. 6(A).

As mentioned above, the laser device of this example produces little ineffective current so that oscillating operation at a high output power of 70 mW or more at room temperature can be achieved. Moreover, the effect on heat generation due to ineffective current is so small that laser oscillatior can be attained even at a temperature of as high as 140° C. or more.

Although the above-mentioned example disclosed only a device in which a p-substrate was used for the growth substrate, a device using an n-substrate therein as the growth substrate can attain the same effect as mentioned above. The impurity to be diffused into the first burying layer 5 is not limited to Zn, but any p-impurity of Cd, etc., can be used. Although InP was used for the first, second and third burying layers, other semiconductor materials such as InGaAsP, etc., having a refractive index smaller than that of the active layer and having an energy gap smaller than that of the active layer can be used. The epitaxial growth layers are not limited to the InGaAsP/InP system, but they can be of the GaAlAs/GaAs system, etc.

EXAMPLE 3

This example provides a buried type semiconductor laser device, wherein the laser-oscillation operating area is formed within a striped channel reaching the substrate through the burying layer disposed on said substrate and is sandwiched between one part of the burying layer and another part of the burying layer through a diffusion region formed on the inner wall of said channel so as to electrically isolate said burying layer from the cladding layer of the laser-oscillation operating area. The diffusion region is formed on the whole area of the inner wall of said striped channel.

Figure 8A:
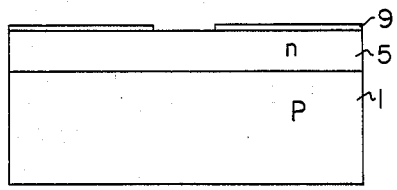
FIGS. 8(A), 8(B) and 8(C) are diagrams showing a process for the production of the semiconductor laser device shown in FIG. 7.
Figure 8B:
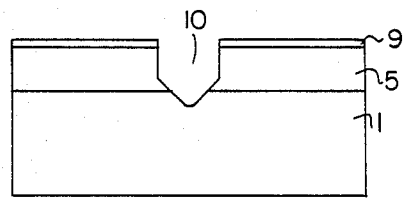
Figure 8C:
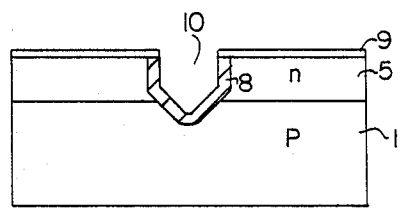

FIG. 7 shows the semiconductor laser device of this example which is produced as follows: On the (100) plane of a p-InP substrate 1, an n-InP first burying layer 5 is grown by liquid phase epitaxy. Then, a silicon nitride (SiNx) film 9 is formed on the first burying layer 5 by plasma assisted chemical vapor deposition, followed by forming a photoresist (not shown) into a striped pattern having a width of 3 μm in the <011> direction on the silicon nitride film 9 by photolithography. Then, the silicon nitride film 9 is etched by an etchant (HF:NH$_4$F=1:40), using the striped photoresist as a masking substance as shown in FIG. 8(A). Then, as shown in FIG. 8(B), a striped channel 10 having a width of 3 μm and having a V-shaped bottom is formed in the InP substrate 1 through the burying layer 5 by an etching technique, wherein concentrated hydrochloric acid is used as an etchant and the silicon nitride film 9 is employed as masking substance. Then, a p-impurity such as Zn is diffused into the p-InP substrate 1 along the inner wall of the channel 10 to form a Zn diffusion region 8 having a spread of 0.5 μm as shown in FIG. 8(C). The spread of the diffusion region 8 can be set in the range of 1 μm to 5 μm. Then, the silicon nitride film 9 is removed, and as shown in FIG. 7, a p-InP buffer layer 2 and a p-InP second burying layer 6 are simultaneously grown by liquid phase epitaxy, followed by simultaneously growing a non-doped InGaAsP active layer 3 and a p-InP third burying layer 6'. The active layer 3 has a refractive index higher than that of the buffer layer 2 and has an energy gap smaller than that of the buffer layer 2. Then, an n-InP cladding layer 4 is grown on both the active layer 3 and the third burying layer 6' by liquid phase epitaxy, resulting in a multi-layered crystal structure. The buffer layer 2 and the active layer 3 formed within the striped channel 10 constitute a laser oscillation operating area. The second burying layer 6 and the third burying layer 6' are successively disposed on the first burying layer 5 positioned outside of the channel 10. The n-cladding layer 4 is positioned at both the inside and the outside of the channel 10. As a result, the laser-oscillation operating area is sandwiched between one part of the burying layer 5 and another part of the burying layer 5 through the diffusion region 8. Then, a p-sided electrode (not shown) and an n-sided electrode are formed on the back face of the substrate 1 and the upper face of the cladding layer 4, respectively, followed by cleaving at the (011) plane to form a semiconductor laser device.

One main feature of this semiconductor laser device is in that the first burying layer 5 is electrically isolated from the cladding layer 4 by the Zn diffusion region 8 having a polarity different from those of the layers 4 and 5, so that the gate current 7b such as that discussed in FIG. 14 never flows from the cladding layer 4 into the first burying layer 5. Thus, the current 7 injected to achieve laser oscillation can be effectively confined within the striped active layer 3, and moreover even though the injected current 7 is increased in order to increase the output power of the device, the current blocking layer of a thyristor composed of the cladding layer 4, the second burying layer 6, the first burying layer 5, and a buffer layer 2 (or the substrate 1) is maintained to be non-conductive, thereby maintaining the ineffective current at a low level. This fact can be explained in greater detail by FIG. 6 in the same manner as in Example 2. The laser device of this example produces little ineffective current so that oscillating operation at a high output power of 70 mW or more at room temperature can be achieved. Moreover, the effect on heat generation due to ineffective current is so small that laser oscillation can be attained even at a temperature of as high as 140° C. or more.

Although the above-mentioned example disclosed only a device in which a p-substrate was used for the growth substrate, a device using an n-substrate therein as the growth substrate can attain the same effect as mentioned above. Any p-impurity of Cd, etc., other than Zn can be used for the diffusion region 8. Although InP was used for the first, second and third burying layers, other semiconductor materials such as InGaAsP, etc., having a refractive index smaller than that of the active layer and having an energy gap smaller than that of the active layer can be used. The epitaxial growth layers are not limited to the InGaAsP/InP system, but they can be of the GaAlAs/GaAs system, etc.

EXAMPLE 4

This example provides a buried type semiconductor laser device, wherein the laser-oscillation operating area is formed within a striped channel formed in the central area of the substrate and is sandwiched between one part of the burying layer and another part of the burying layer, which are formed by diffusing an impurity into the outside of the central area of said substrate, through the portion of said substrate positioned between said laser-oscillation operating area and each part of said burying layer, thereby electrically isolating said burying layer from the cladding layer of said laser-oscillation operating area.

Figure 9:
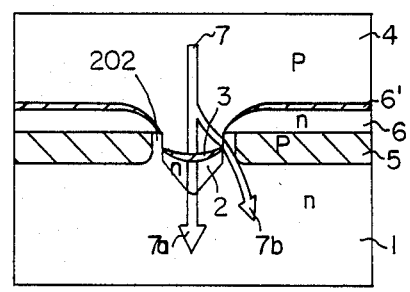
FIG. 9 is a sectional front view showing another semiconductor laser device of this invention.
Figure 10A:
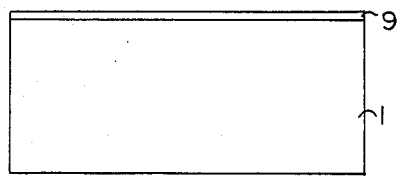
FIGS. 10(A), 10(B) and 10(C) are diagrams showing a process for the production of the semiconductor laser device shown in FIG. 9.
Figure 10B:
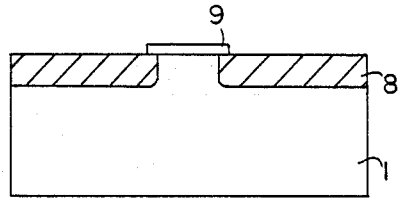
Figure 10C:
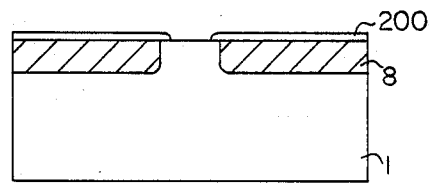

FIG. 9 shows the semiconductor laser device of this example which is produced as follows: On the (100) plane of an n-InP substrate 1, a silicon nitride (SiNx) film 9 is formed by plasma assisted chemical vapor deposition as shown in FIG. 10(A). Then, a photoresist (not shown) is formed into a striped pattern having a width of 6 μm in the <011> direction on the silicon nitride film 9 by photolithography, and the silicon nitride film 9 is etched by an etchant (HF:NH$_4$F=1:40), using the striped photoresist as a masking substance, as shown in FIG. 10(B), followed by diffusing a p-impurity such as Zn into the n-substrate 1, using the striped silicon nitride film 9 as a masking substance, to form a Zn diffusion region 8 (corresponding to a p-first burying layer 5 in FIG. 9) having a depth of 1 μm. Then, the striped silicon nitride film 9 is removed and photoresist masks 200 are formed by photolithography, as shown in FIG. 10(C), on both sides of the central area (the width thereof being about 3 μm) of the substrate 1, in which the Zn diffusion region 8 is not spread over the portion (the width thereof being about 5 μm) of the substrate 1 positioned below the above-mentioned striped silicon nitride film 9. In order for the end of each of the photoresist masks 200 to be accurately positioned in the area in which the Zn impurity is not diffused, the photoresist is preferably coated on the substrate after the Zn diffusion region 8 is selectively etched by a mixture solution (KOH:K$_3$Fe(CN)$_6$:H$_2$O=1:1:6) to form a step between the Zn diffusion region and the non-diffusion region.

Figure 10D:
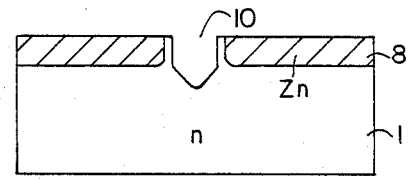

Then, as shown in FIG. 10(D), a striped channel 10 having a depth of 2 μm is formed in the substrate 1 by an etching technique using concentrated hydrochloric acid, wherein the photoresist masks 200 are used as a masking substance. The bottom of the striped channel 10 is of a V-shape.

Then, as shown in FIG. 9, an n-InP buffer layer 2 and an n-InP second burying layer 6 are simultaneously grown by liquid phase epitaxy, followed by simultaneously growing a non-doped InGaAsP active layer 3 and an n-InP third burying layer 6'. The active layer 3 has a refractive index higher than that of the buffer layer 2 and an energy gap smaller than that of the buffer layer 2. Then, a p-InP cladding layer 4 is grown on both the active layer 3 and the third burying layer 6' by liquid phase epitaxy, resulting in a multi-layered crystal structure. The buffer layer 2 and the active layer 3 formed within the striped channel 10 constitute a laser oscillation operating area. The second burying layer 6 and the third burying layer 6' are successively disposed on the first burying layer 5 positioned outside of the channel 10. The p-cladding layer 4 is positioned at both the inside and the outside of the channel 10. As a result, the laser-oscillation operating area is sandwiched between one part of the burying layer 5 and another part of the burying layer 5 through the portion 202 of the substrate 1. Then, an n-sided electrode (not shown) and a p-sided electrode (not shown) are formed on the back face of the substrate 1 and the upper face of the cladding layer 4, respectively, followed by cleaving at the (011) plane to form a semiconductor laser device.

One main feature of this semiconductor laser device is in that the first burying layer 5 (i.e., the Zn diffusion region 8) is electrically isolated from the cladding layer 4 by the substrate 1 having a polarity different from those of the layers 4 and 5, so that the gate current $7b$ such as that discussed in FIG. 14 never flows from the cladding layer 4 into the first burying layer 5. Thus, even though the injected current 7 is increased in order to increase the output power of the device, the current blocking layer of athyristor composed of the cladding layer 4, the second burying layer 6, the first burying layer 5 (i.e., the Zn diffusion region 8) and the substrate 1 is maintained to be non-conductive, thereby maintaining the ineffective current at an extremely low level. This fact can be explained in greater detail by FIG. 6 in the same manner as in Example 2, except that the diode $D_s$ corresponds to the p-n junction formed by the cladding layer 4 and the substrate 1.

As mentioned above, the laser device of this example produces little ineffective current so that oscillating operation at a high output power of 70 mW or more at room temperature can be achieved. Moreover, the effect on heat generation due to ineffective current is so small that laser oscillatior can be attained even at a temperature of as high as 140° C. or more.

Although the above-mentioned example disclosed only a device in which an n-substrate was used for the growth substrate, a device using a p-substrate therein as the growth substrate can attain the same effect as mentioned above. Any p-impurity of Cd, etc., other than Zn can be used for the diffusion region 8. Although InP was used for the second and third burying layers, other semiconductor materials such as InGaAsP, etc., having a refractive index smaller than that of the active layer and having an energy gap smaller than that of the active layer can be used for the burying layers. The epitaxial growth layers are not limited to the InGaAsP/InP system, but they can be of the GaAlAs/GaAs system, etc.

EXAMPLE 5

This example provides a buried type semiconductor laser device, wherein the laser-oscillation operating area is formed into a mesa-stripe on the substrate and is sandwiched between one part of the burying layer and another part of the burying layer, which are disposed outside of said mesa, through a diffusion region formed on the outer wall of said mesa, thereby electrically isolating said burying layer from a cladding layer of said laser-oscillation operating area.

Figure 11:
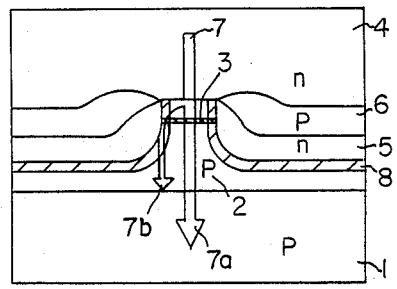
FIG. 11 is a sectional front view showing another semiconductor laser device of this invention.

FIG. 11 shows the semiconductor laser device of this example which is produced as follows: On the (100) plane of a p-InP substrate 1, a p-InP buffer layer 2, a non-doped InGaAsP active layer 3, and an n-InP cladding layer 4 are successively grown by liquid phase epitaxy as shown in FIG. 12(A). The InGaAsP semiconductor material used for the active layer has an energy gap smaller than that of the InP semiconductor material used for the buffer layer, etc., and has a refractive index higher than that of the InP semiconductor material. Then, a silicon nitride (SiNx) film having a thickness of about 2000 Å is formed on the cladding layer 4 by plasma assisted chemical vapor deposition, etc., and a photoresist 200 is formed into a striped pattern having a width of 4 μm in the <011> direction on the silicon nitride film, followed by etching the silicon nitride film 9 by an etchant (HF:NH$_4$F=1:40) using the striped photoresist 10 as a masking substance, resulting in a striped silicon nitride film 9, as shown in FIG. 12(B). Then, as shown in FIG. 12(C), the wafer is etched from the n-InP cladding layer 4 to the p-InP buffer layer 2 by a Br-methanol solution containing Br in a concentration of 0.2%, using the striped silicon nitride film 9 as a masking substance, resulting in a mesa-striped structure 11 which constitutes a laser-oscillation operating area. Thereafter, as shown in FIG. 12(D), a p-impurity such as Zn is diffused within the region at a distance of 0.5 μm from the etched surface of each of the buffer layer 2, the active layer 3 and the cladding layer 4, resulting in a Zn diffusion region 8 indicated by shaded parts in FIG. 12(D). Then, the striped silicon nitride film 9 is removed and as shown in FIG. 11, an n-InP first burying layer 5, a p-InP second burying layer 6, and an n-cladding layer 4 are successively grown by liquid phase epitaxy. The mesa is so narrow that the first and second burying layers 5 and 6 cannot be grown on the mesa. Thus, after the outside of the mesa is buried with these burying layers 5 and 6, the cladding layer 4 should be grown, so that the cladding layer 4 can be formed on the whole surface of the wafer (Mito et al: Denshi Tsushin Gakkai Technical Report OQE 80-116). As a result, the laser-oscillation operating area is sandwiched between one part of the burying layer 5 and another part of the burying layer 5 through the diffusion region 8.

Then, a p-sided electrode (not shown) and an n-sided electrode (not shown) are formed on the back face of the substrate 1 and the upper face of the cladding layer 4, respectively, followed by cleaving at the (011) plane to form a semiconductor laser device.

One main feature of this semiconductor laser device is in that the first burying layer 5 is electrically isolated from the cladding layer $4b$) the Zn diffusion region 8 having a polarity different from those of the layers 4 and 5, so that the gate current $7b$ such as that discussed in FIG. 14 never flows from the cladding layer 4 into the first burying layer 5. Thus, even though the injected current 7 is increased, the current blocking layer of a thyristor composed of the cladding layer 4, the second burying layer 6, the first burying layer 5 and the buffer layer 2 (or the substrate 1) is maintained to be non-conductive, thereby maintaining the ineffective current at an extremely low level, so that laser oscillation can be attained with high efficiency up to a high output power. This fact can be explained in greater detail by FIG. 6 in the same manner as in Example 2, except that the diode $D_s$ corresponds to the p-n junction formed by the cladding layer 4 and the Zn diffusion region 8.

As mentioned above, the laser device of this example produces little ineffective current so that oscillating operation at a high output power of 70 mW or more at room temperature can be achieved. Moreover, the effect on heat generation due to ineffective current is so small that laser oscillation can be attained even at a temperature of as high as 140° C. or more.

Although the above-mentioned example disclosed only a device in which a p-substrate was used for the growth substrate, a device using an n-substrate therein as the growth substrate can be attain the same effect as mentioned above. Although InP was used for the first and second burying layers, other semiconductor materials such as InGaAsP, etc., having a refractive index smaller than that of the active layer and having an energy gap smaller than that of the active layer can be used for the burying layers. The epitaxial growth layers are not limited to the InGaAsP/InP system, but they can be of the GaAlAs/GaAs system, etc.

EXAMPLE 6

Figure 13:
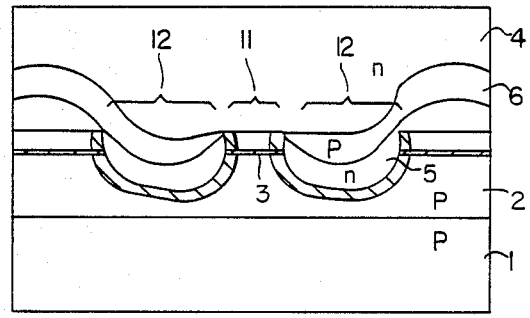
FIG. 13 is a sectional front view showing another semiconductor laser device of this invention.

FIG. 13 shows another semiconductor laser device of this invention which is produced in the same manner as in Example 5, except that the wafer is etched from the n-InP cladding layer 4 to the p-InP buffer layer 2 to form two striped channels 12 and 12 having a width of about 10 μm in a parallel manner, resulting in the mesa 11 positioned between the striped channels 12 and 12, followed by removal of the striped silicon nitride film 9. Then, the first burying layer 5 and the second burying layer 6 are successively grown on the area other than the mesa 11 by liquid phase epitaxy, resulting in a current blocking layer. The mesa 11 is so narrow that these burying layers 5 and 6 cannot be grown thereon. The electrically equivalent circuit of this device is the same as that of the device of Example 5, except that the junction area of the diode $D_s$ of this example functioning as a path for leakage current is double that of the diode $D_s$ of Example 5. The device of this example is advantageous over the device of Example 5 in yield because the wafer of this example is less etched than that of Example 5.

The device of this example also produces little ineffective current for the same reasons as mentioned in Example 5, so that oscillating operation at a high output power of 70 mW or more at room temperature can be achieved. Moreover, the effect on heat generation due to ineffective current is so small that laser oscillation can be attained even at a temperature of as high as 140° C. or more.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device comprising a semiconductor substrate and a multi-layer crystal structure formed on said substrate, the device wherein:
    said structure is of a first conductivity type;
    said multi-layer crystal structure comprises at least an active layer and a cladding layer disposed on said active layer, said cladding layer being of a second conductivity type;
    a striped mesa-portion including at least one portion of said active layer and said cladding layer is formed at the upper region of said multi-layer crystal structure, said striped mesa-portion extending from one facet to the opposite facet;
    each of the lateral sides of said striped mesa-portion is buried by a first burying layer of the second conductivity type;
    the upper face of said first burying layer is covered by a second burying layer of the first conductivity type;
    the upper faces of said striped mesa-portion and said second burying layer are covered by a third layer of the second conductivity type; and
    a diffusion region of the first conductivity type is formed at each of the side walls of said striped mesa-portion.

2. A semiconductor laser device according to claim 1, wherein said striped mesa-portion is formed by two channels disposed in said multi-layer crystal structure.

3. A semiconductor laser device according to claim 1, wherein said multi-layer crystal structure is formed on the (100) plane of said substrate and said striped mesa-portion is formed in the <011> direction of said substrate.

* * * * *